United States Patent
Tsai et al.

(10) Patent No.: US 6,326,296 B1
(45) Date of Patent: Dec. 4, 2001

(54) METHOD OF FORMING DUAL DAMASCENE STRUCTURE WITH IMPROVED CONTACT/VIA EDGE INTEGRITY

(75) Inventors: Chia Shiung Tsai; Hun-Jan Tao, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/108,867

(22) Filed: Jul. 1, 1998

(51) Int. Cl.[7] .................................................. H01L 21/4763
(52) U.S. Cl. .......................... 438/624; 438/638; 438/780
(58) Field of Search ................................ 438/638, 624, 438/780

(56) References Cited

U.S. PATENT DOCUMENTS

| | | | |
|---|---|---|---|
| 4,804,431 | * 2/1989 | Ribner | 156/35 |
| 5,269,879 | * 12/1993 | Rhoades et al | 156/643 |
| 5,422,309 | 6/1995 | Zettler et al. | 437/192 |
| 5,497,017 | 3/1996 | Gonzaleos | 257/306 |
| 5,529,953 | 6/1996 | Shoda | 437/189 |
| 5,589,706 | 12/1996 | Mitwalsky et al. | 257/529 |
| 5,602,053 | 2/1997 | Zheng et al. | 437/60 |
| 5,614,765 | 3/1997 | Aranzino et al. | 257/774 |
| 5,677,243 | 10/1997 | Ohsaki | 437/195 |
| 5,801,099 | * 9/1998 | Kim et al. | 438/666 |
| 5,926,732 | * 7/1999 | Matsuura | 438/622 |
| 5,930,627 | * 7/1999 | Zhou et al. | 438/257 |
| 5,989,997 | * 11/1999 | Lin et al. | 438/622 |

* cited by examiner

Primary Examiner—Wael Fahmy
Assistant Examiner—Kurt Eaton
(74) Attorney, Agent, or Firm—George O. Saile; Stephen B. Ackerman; Sevgin Oktay

(57) ABSTRACT

A new method of forming a dual damascene interconnect is disclosed for manufacturing semiconductor substrates. A contact/via hole is first formed in a first dielectric layer formed over a substructure of a substrate having devices formed therein and/or metal layers formed thereon. The contact/via hole is filled with a protective material prior to forming a second dielectric layer. Conductive line opening is formed in the second dielectric layer and over the contact/via hole having the protective material in it. The protective material protects the edge of the contact/via hole from damage due to the second etching of the conductive line opening. Thus, a dual damascene structure is disclosed wherein the integrity of the edge of the contact/via hole is preserved, avoiding any reliability problems in the semiconductor product.

28 Claims, 4 Drawing Sheets

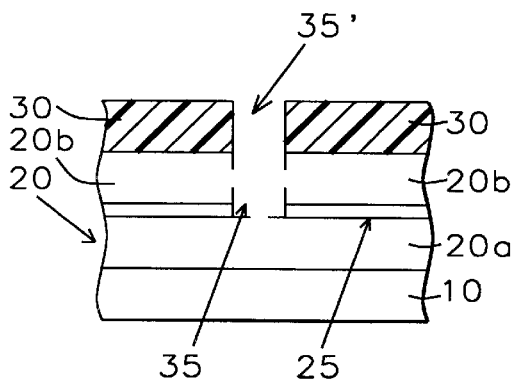
FIG. 1a – Prior Art
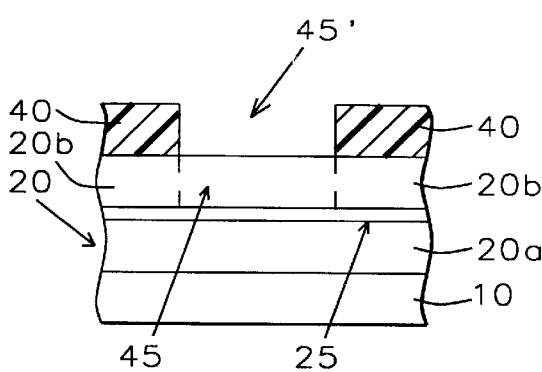
FIG. 2a – Prior Art
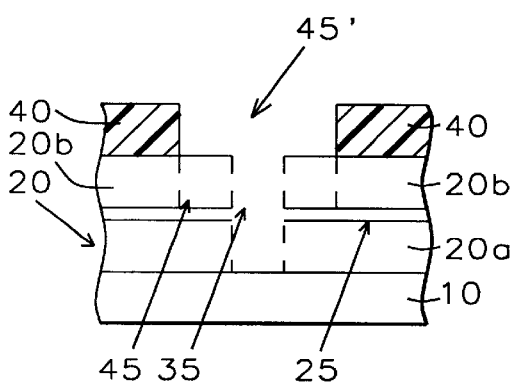
FIG. 1b – Prior Art
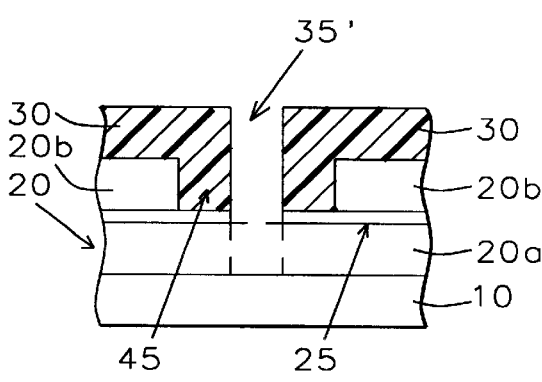
FIG. 2b – Prior Art
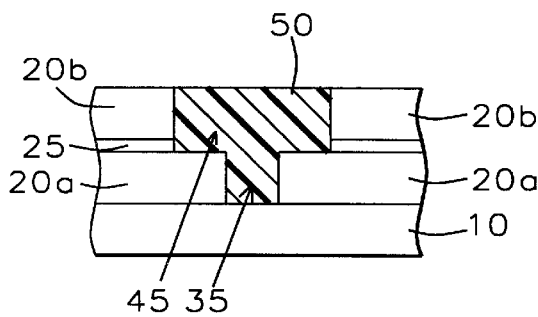
FIG. 1c – Prior Art
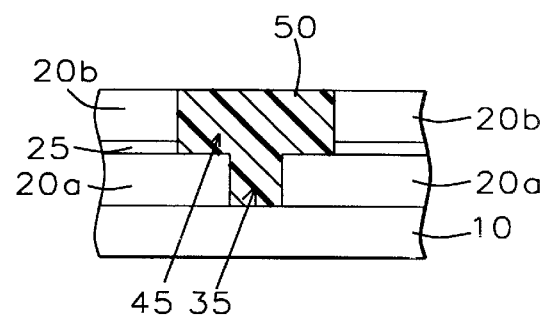
FIG. 2c – Prior Art

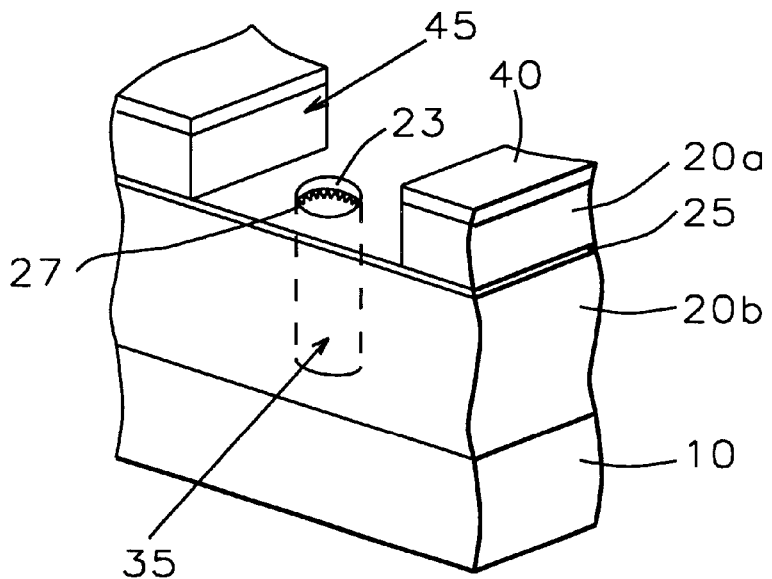
FIG. 3a – Prior Art
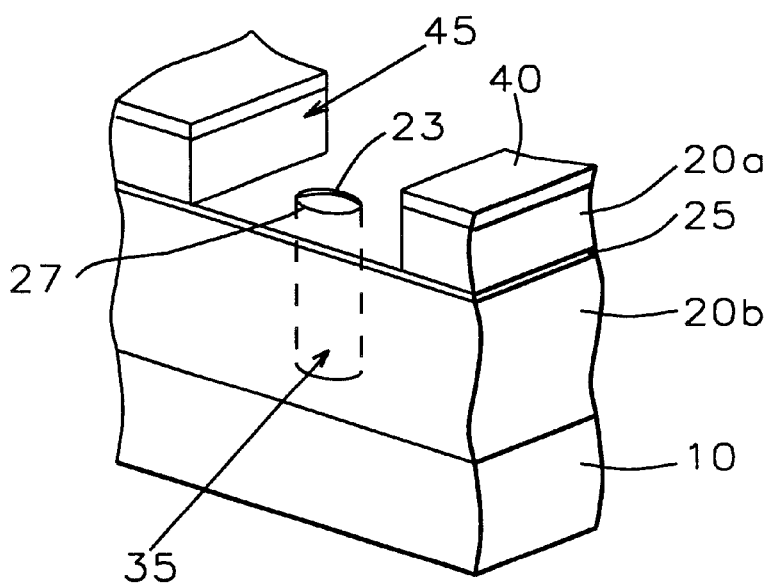
FIG. 3b

METHOD OF FORMING DUAL DAMASCENE STRUCTURE WITH IMPROVED CONTACT/VIA EDGE INTEGRITY

BACKGROUND OF THE INVENTION (1) Field of the Invention

The present invention relates to the manufacture of ultra large scale integrated (ULSI) circuit chips in general, and in particular, to forming interconnects in a semiconductor substrate by using an improved dual damascene process.

(2) Description of the Related Art

Damascene is an old known art of inlaying, that is, inserting metal into incisions made in stone, wood or metal. The damascene process used in today's semiconductor manufacturing is a derivative of the same, except for the precision and accuracy with which the process has been developed and is being practiced. The damascene process lends itself very well to the manufacturing of very and ultra scale integrated (VLSI and ULSI) circuits where myriad interconnections are made between passive and active devices within a semiconductor substrate, as well as between a multitude of wiring layers that constitute the circuits on the substrate. Damascene is a process which simplifies the forming of interconnections in a semiconductor substrate.

In a single damascene process, incisions, or grooves, are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The process is repeated as many times as required to form the multi-level interconnections between metal lines and the holes formed in between. Contact holes are formed directly over the substrate where the metal in the hole contacts the surface of the substrate, while the via holes are formed between metal layers.

In contrast, conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket-metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate.

In the standard dual damascene process an insulating layer, (20), shown in FIG. 1a, is coated with a resist material, (30), which is exposed to a first mask with the image pattern of a hole opening (35') for either a contact or via hole, and the pattern is anisotropically etched, (35), in the upper half (20b) of the insulating layer. The hole depth in the insulating layer can be controlled by timed-etch. That is, the etch is stopped after a predetermined period of time. However, timed-etch is not always reliable. In order to have a better control on the depth of the hole, an etch-stop layer is also be used, as is well known in the art. Etch-stop layer is usually a thin conformal material such as silicon nitride ($Si_3N_4$, SiN), silicon oxynitride ($SiO_xN_y$), or titanium nitride (TiN) which have high selectivity to the etchant. Thus, hole opening (35) in layer (20) stops at etch-stop layer (25) shown in FIG. 1a. The etchant is then modified to etch the hole pattern through the etch-stop layer and stop at the insulating layer below. After etching, patterned resist material (30) is removed, insulating layer (20) is coated with another resist material (40) and exposed to a second mask with image pattern of conductive lines (45') in alignment with hole openings (35). In anisotropically etching the openings for the conductive line in the upper half of the insulating material, the hole openings already present in the upper half are simultaneously etched in the lower half (20a) of the insulating material. After the etching is complete, both the hole openings and conductive line openings are filled with metal (50), and any excess material on the surface of the substrate is removed by chemical mechanical polishing.

In another approach for the dual damascene process, the conductive line openings, (45'), are etched first into the upper half of the insulating material, (20b), as shown in FIG. 2a, using an etch-stop layer (25). Resist material, (30), is next formed over the substrate, thus filling the line opening (45), and patterned with hole opening (35'), as shown in FIG. 2b. The hole pattern is then etched into the lower half (20a) of the insulating material, thus forming the dual damascene structure. Again, after the etching is complete, both the hole openings and conductive line openings are filled with metal (50), and any excess material on the surface of the substrate is removed by chemical mechanical polishing.

Other variations on the damascene interconnect process are disclosed in U.S. Pat. No. 5,589,706, U.S. Pat. No. 5,602,053, U.S. Pat. 5,614,765 in which the latter patent discloses a self-aligned dual damascene. In U.S. Pat. No. 5,422,309, Zettler, et al., teach a method for forming an interconnect. An opening is formed in an insulating layer. For producing an interconnect mask, a photoresist layer is applied, exposed and developed such that the surface of the regions to be contacted remains covered with photoresist in exposed regions, whereas the surface of the insulating layer is uncovered in the exposed regions. Using the interconnect mask as etching mask, conductive line openings are etched into the insulating layer. Oshaki, et al., in U.S. Pat. No. 5,677,243 show a method of forming a multi-layer interconnection. The method includes: forming a hole reaching the first conductive layer in the insulating layer; forming an organic layer at least filling the hole; removing a portion of the insulating layer at a portion at which the insulating layer contacts an organic layer filling the hole; removing the organic layer filling the hole to form a recessed portion continuous to the hole in the insulating layer; and forming a second conductive layer in such a manner that it fills the hole and the recessed portion.

Although standard dual damascene processes offer advantages over other conventional processes for forming interconnections, there are a number of disadvantages, such as the edges of the hole openings in the lower half of the insulating layer being poorly defined because of the two etchings and the hole edges being unprotected during the second etching. The problem is illustrated in FIG. 3a, which is a three-dimensional rendition of a portion of FIG. 1b. As can be seen there, edge (23) of hole opening (35) in the lower portion (20a) of the insulating layer (20) is irregular and nonuniform due to etching. Furthermore, adequate nitride corner selectivity during etching contact/via hole is difficult to achieve for proper hole edge profile integrity. Also, nitride thickness should be relatively thin (<1500 Å)

to avoid stride stress and associated crack. High photoresist selectivity is required for uniformity of hole edge, and critical dimension (CD) control of the hole opening (35) as well as that of conductive line opening (45). Thus, improvements are needed in the prior art damascene processes to provide better contact/via hole profile as shown in FIG. 3b and as disclosed in the embodiments of this invention.

SUMMARY OF THE INVENTION

It is therefore an object of the present invention to provide a method of forming interconnections in a semiconductor substrate by using an organic filler in holes in an improved damascene process.

It is another object of this invention to provide a method of forming a dual damascene structure with improved contact hole edge integrity.

It is still another object of this invention to provide a method of forming a dual damascene structure with improved via hole edge integrity.

These objects are accomplished by providing a semiconductor substrate having a substructure comprising devices therein and/or a metal layer formed thereon on a substrate; forming a lower level dielectric (LLD) layer over the substrate; forming an etch-stop layer over the LLD layer; forming a first photoresist layer over the etch-stop layer; patterning the first photoresist layer with a contact or via hole pattern; etching the contact/via hole pattern into the etch-stop layer; etching further the contact/via hole pattern into the LLD layer until the substructure of the substrate is reached; removing the first photoresist layer from the substrate; depositing organic material over the etch-stop layer and filling the contact/via hole opening in the etch-stop layer and in the LLD layer with the organic material; performing etch-back of the organic material and uncovering the etch-stop layer; forming an upper level dielectric (ULD) layer over the etch-stop layer including the contact/via hole opening in the etch-stop layer and in the LLD layer filled with the organic material; forming a second photoresist layer over the ULD layer; patterning the second photoresist layer with a conductive line opening pattern; etching through the conductive line opening in the second photoresist layer into the ULD layer until etch-stop layer is reached; removing the second photoresist layer; removing remaining the organic material from the contact/via hole opening in the LLD layer; forming metal in the conductive line opening in the ULD layer and contact/via hole opening through the etch-stop layer and in the LLD layer; and removing the metal from the surface of the substrate for subsequent process steps to complete the fabrication of a semiconductor substrate.

BRIEF DESCRIPTION OF THE DRAWINGS

FIGS. 1a–1c show the forming of a dual damascene structure according to prior art.

FIGS. 2a–2c show the forming of a dual damascene structure according to still another prior art method.

FIG. 3a shows the damaged edge of a contact/via hole of prior art methods.

FIG. 3b shows the undamaged edge of a contact/via hole of this invention.

DESCRIPTION OF THE PREFERRED EMBODIMENTS

Referring now the drawings, in particular to FIGS. 4a–4h, there is shown a method of forming a dual damascene structure with a protective material being used as a filler in contact and via holes so that the edges of the holes are not damaged while etching conductive line openings over the holes.

Figure 4A:
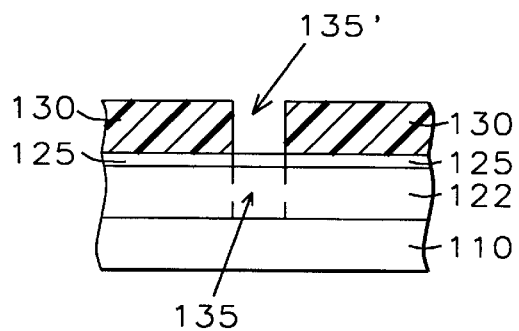
FIG. 4a shows the patterning of a resist layer with the image of a contact/via hole opening on a etch-stop layer overlying a first dielectric layer, according to this invention.

FIG. 4a shows a portion of a semiconductor substrate (110), preferably silicon, provided with a substructure of devices (not shown) formed in the substrate or, portions of metal layers thereof, and as they are not significant to the invention, they are not described in detail in order not to unnecessarily obscure the present invention. It will be noted that in a first embodiment of the present invention that is disclosed, the process of forming a damascene interconnect will start by first forming a contact hole contacting a substructure containing devices formed in a substrate. Therefore, the proposed protective filler in the hole will be contacting the substrate surface, such as silicon. In the second embodiment, a via hole will be formed contacting a substructure containing a lower metal interconnect layer. Hence, the protective filler in the via hole will be contacting the underlying metal layer. The conductive line opening of the damascene structure will next be formed over the respective contact or via hole openings containing the organic material. It is also noted that to distinguish the insulating layer formed over the devices in the substrate and containing the contact hole from the insulating layer formed between metal layers and containing the via hole, the former will be referred to as interlevel dielectric (ILD) layer, and the latter, as intermetal dielectric (IMD) layer.

In FIG. 4a, first ILD layer (122) is formed over a substructure of substrate (110) having devices formed therein. As dielectric layers are known in the art, they may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, first ILD layer (122) comprises plasma enhanced (PE) oxide or TEOS chemical vapor deposited and then subjected to chemical mechanical polishing to attain a thickness between about 8,000 to 12,000 angstroms (Å).

Next, etch-stop layer (125) is formed over first ILD layer (125) as shown in FIG. 4a. Etch-stop layer (125) is a thin conformal material which can be silicon nitride (Si$_3$N$_4$, SiN), silicon oxynitride (SiO$_x$N$_y$) SiON is chemical vapor deposited (CVD) by reacting SiH$_4$ with N$_2$O and He at flow rates between about 60 to 80, 90 to 110 and 100 to 200 sccm, respectively, at a pressure between about 1 to 5 torr, energy between about 120 to 140 watts, and temperature between about 330 to 360° C. The preferred thickness of SiON is between about 200 to 500 Å.

After the forming of ILD and etch-stop layers, a first photoresist layer (130) of a thickness between about 7,000 to 9,000 Å is formed and then patterned with a mask having contact hole pattern (135'), as shown in FIG. 4a. Contact hole pattern is next etched into etch-stop layer (125) using a reactive ion etch (RIE) recipe comprising gases Ar, CHF$_3$ and CF$_4$ at a pressure between about 100 to 200 mTorr, or using a high density plasma (HDP) oxide etcher with gases C$_2$F$_6$, C$_4$F$_8$ and Ar at a pressure between about 5 to 15 mTorr. contacts substructure of devices (not shown) formed in and on the surface of substrate (110).

Figure 4D:
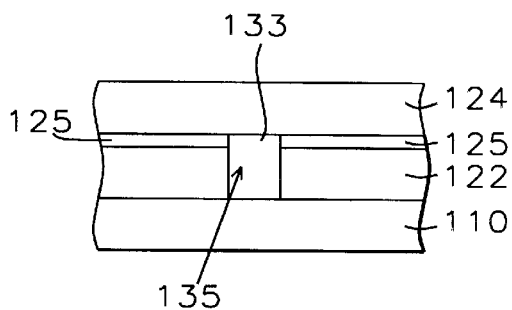
FIG. 4d shows the forming of the second dielectric layer over the filled hole and the first dielectric layer, according to this invention.
Figure 4B:
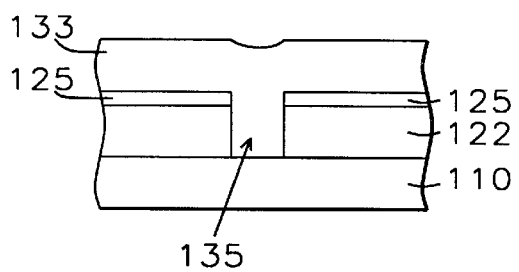
FIG. 4b shows a main feature of the present invention where the contact/via hole is filled with a material which protects the edge of the hole.
Figure 4E:
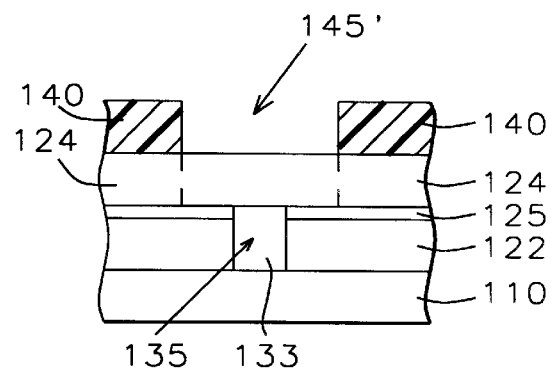
FIG. 4e shows the forming of a conductive line opening pattern on a photoresist layer that has been deposited over the second dielectric, according to this invention.
Figure 4C:
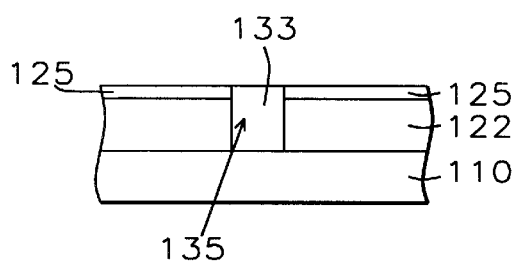
FIG. 4c shows the removing of the protective material from the surface of the first dielectric layer, according to this invention.
Figure 4F:
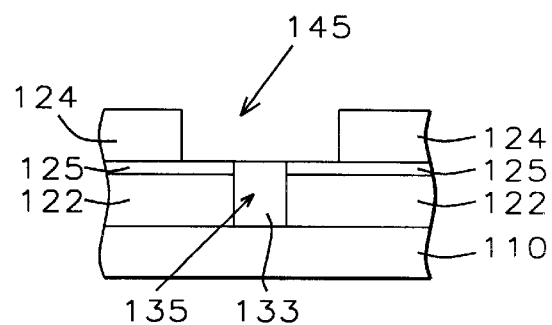
FIG. 4f shows the forming of the conductive line opening in the second dielectric layer, and over the hole filled with a protective material, according to this invention.
Figure 4G:
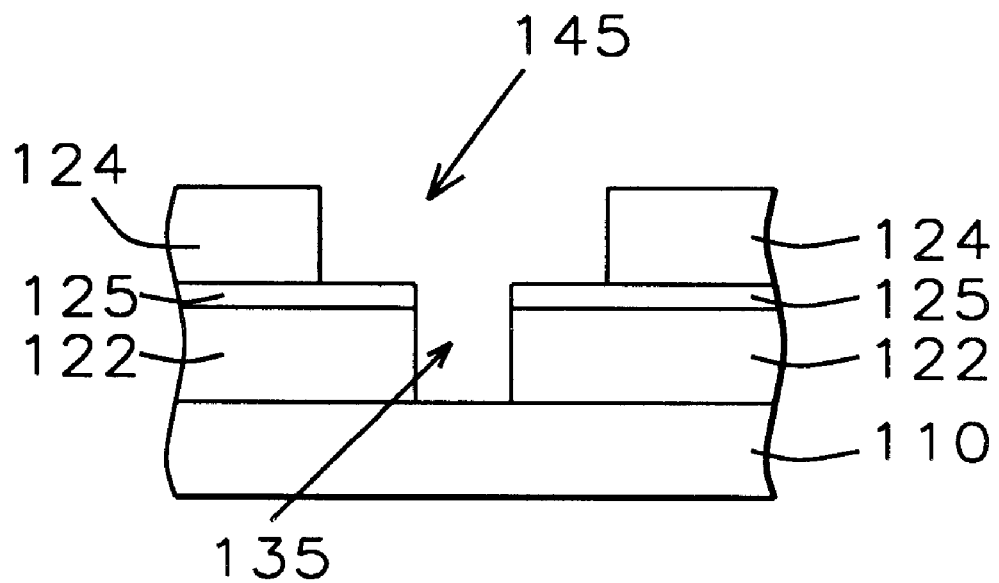
FIG. 4g shows the composite conductive line and hole structure of the damascene structure formed after the removal of the protective material from the contact/via hole, according to this invention.

As a main feature and key aspect of the invention, protective material (133) is deposited in contact hole (135) and over etch-stop layer (125), thereby filling contact hole (135) as shown in FIG. 4b. Protective layer (133) can be spin-on-glass (SOG), low-k dielectric, or an anti-reflective-coating, which are well-known in the field. It is preferred in this embodiment that protective layer (133) comprise of an organic photoresist material. Organic material (133) is then etched back by oxygen plasma with a microwave source so as to expose the surface of etch-stop layer (125) as shown in FIG. 4c. It is important that the surface of organic material (133) in contact hole (135) is flat and level with respect to the surface of etch-stop layer (125) as shown in FIG. 4c. This is because, the edge of contact hole (135) must be protected from uncontrolled etch when conductive line opening is later etched into a second ILD layer deposited over the etch-stop layer and the contact hole as shown in FIG. 4d.

Second ILD layer (124) is shown in FIG. 4d, and it is preferred that it comprises a low-k dielectric, PE-TEOS, PE-oxide, or spin-on-glass (SOG) having a thickness between about 4,000 to 7,000 angstroms (Å). A second photoresist layer (140) is formed over second ILD layer (124) and patterned with a mask containing conductive line images (145') as shown in FIG. 4e. Next, pattern (145') is etched into second ILD layer with an enchant having high selectivity to etch-stop layer (125) and filler organic material (133) in contact hole opening (135). It is preferred that the etch recipe comprises reactive ion etch (RIE) using gases C$_4$F$_8$, Ar, CHF$_3$ and CF$_4$ at a pressure between about 50 to 100 mTorr, or using a high density plasma (HDP) oxide etcher with gases C$_2$F$_6$, C$_4$F$_8$, CH$_2$F$_2$ and Ar at a pressure between about 5 to 15 mTorr. Subsequently, organic filler (133), preferably of photoresist material, is removed from contact hole (135) by oxygen plasma ashing, resulting in a composite damascene structure shown in FIG. 4g. It will be apparent, therefore, that the edges of contact hole (135) have been protected from the second etching of second dielectric layer (124), and the integrity of the edges preserved.

Figure 4H:
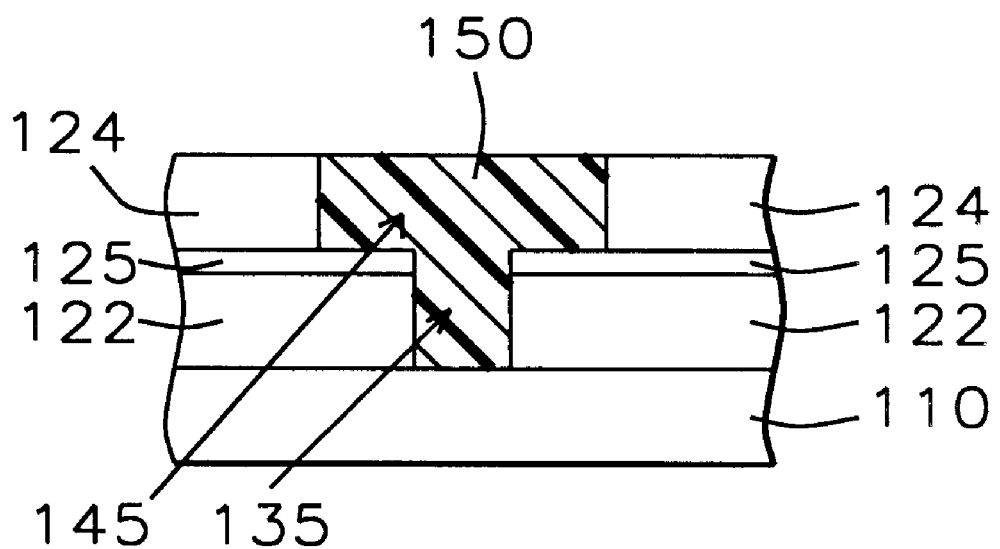
FIG. 4h shows the forming of the final dual damascene interconnect of this invention after the composite conductive line and contact/via hole structure has been filled with metal.

As a final step, the composite conductive line opening (145) and contact hole opening (135) structure is filled with metal, such as tungsten or aluminum-copper, and the excess portions of the metal on the surface of second ILD layer (124) removed by chemical mechanical polishing. The resulting dual damascene interconnect is shown in FIG. 4h.

As a second embodiment of the present invention, a damascene interconnect is formed between metal layers.

Using the same figures as before, FIG. 4a shows a portion of a semiconductor substrate (110), preferably silicon, provided with a substructure of metal layers formed thereon, and as they are not significant to the invention, they are not described in detail in order not to unnecessarily obscure the present invention. The insulating layers separating the metal layers from each other will be referred to as intermetal dielectric (IMD) layers and the interconnect holes in them as via holes.

Using the same Figures as before, and substituting ILD layers with IMD layers, and contact hole with via hole, first IMD layer (122) in FIG. 4a is formed over a substructure of substrate (110) having metal layers formed thereon. It is preferred that first IMD layer (122) comprises plasma enhanced (PE) oxide or TEOS chemical vapor deposited and then subjected to chemical mechanical polishing to attain a thickness between about 8,000 to 12,000 angstroms (Å).

Next, etch-stop layer (125) is formed over first IMD layer (125) as shown in FIG. 4a. Silicon nitride is preferred as the etch-stop layer, because it has high selectivity to the etchant used in etching the dielectric layers. SiON is chemical vapor deposited (CVD) by reacting SiH$_4$ with N$_2$O and He at flow rates between about 60 to 80, 90 to 110 and 100 to 200 sccm, respectively, at a pressure between about 1 to 5 torr, energy between about 120 to 140 watts, and temperature between about 330 to 360° C. The preferred thickness of SiON is between about 200 to 500 Å.

After the forming of the first IMD and etch-stop layers, a first photoresist layer (130) of a thickness between about 7,000 to 9,000 Å is formed and then patterned with a mask having via hole pattern (135'), as shown in FIG. 4a. Contact hole pattern is next etched into etch-stop layer (125) using a recipe comprising reactive ion etch (RIE) using gases Ar, CHF$_3$ and CF$_4$ at a pressure between about 100 to 100 mTorr, or using a high density plasma (HDP) oxide etcher with gases C$_2$F$_6$, C$_4$F$_8$, CH$_2$F$_2$ and Ar at a pressure between about 5 to 15 mTorr. Contact hole (135) contacts substructure of devices (not shown) formed in and on the surface of substrate (110).

As a main feature and key aspect of the invention, protective material (133) is deposited in via hole (135) and over etch-stop layer (125), thereby filling via hole (135) as shown in FIG. 4b. Protective layer (133) can be spin-on-glass (SOG), photo-resist, low-k dielectric, or an anti-reflective-coating, which are well-known in the field. It is preferred in this embodiment that protective layer (133) comprise of an organic photoresist material. Organic material (133) is then etched back by oxygen plasma so as to expose the surface of etch-stop layer (125) as shown in FIG. 4c. It is important that the surface of organic material (133) in via hole (135) is flat and level with respect to the surface of etch-stop layer (125) as shown in FIG. 4c. This is because, the edge of via hole (135) must be protected from uncontrolled etch when conductive line opening is later etched into a second IMD layer deposited over the etch-stop layer and the via hole as shown in FIG. 4d.

Second IMD layer (124) is shown in FIG. 4d, and it is preferred that it comprises a low-k dielectric, PE-TEOS, PE-oxide, or spin-on-glass (SOG) having a thickness between about 4,000 to 7,000 angstroms (Å). A second photoresist layer (140) is formed over second IMD layer (124) and patterned with a mask containing conductive line images (145') as shown in FIG. 4e. Next, pattern (145') is etched into second IMD layer with an enchant having high selectivity to etch-stop layer (125) and filler organic material (133) in via hole opening (135). It is preferred that the etch recipe comprises reactive ion etch (RIE) using gases $C_4F_8$, Ar, $CHF_3$ and $CF_4$ at a pressure between about 50 to 100 mTorr, or using a high density plasma (HDP) oxide etcher with gases $C_2F_6$, $C_4F_8$, $CH_2F_2$ and Ar at a pressure between about 5 to 15 mTorr. Subsequently, organic filler (133), preferably of photoresist material, is removed from via hole (135) by oxygen plasma ashing, resulting in a composite damascene structure shown in FIG. 4g. It will be apparent, therefore, that the edges of via hole (135) have been protected from the second etching of second dielectric layer (124), and the integrity of the edges preserved.

As a final step, the composite conductive line opening (145) and via hole opening (135) structure is filled with metal, such as tungsten or aluminum-copper, and the excess portions of the metal on the surface of second IMD layer (124) removed by chemical mechanical polishing. The resulting dual damascene interconnect is shown in FIG. 4h.

While the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene structure with improved contact hole edge profile comprising the steps of:
    providing a semiconductor substrate having a substructure comprising devices formed in said substrate;
    forming a first interlevel dielectric (ILD) layer over said substrate;
    forming an etch-stop layer over said first ILD layer;
    forming a first photoresist layer over said etch-stop layer;
    patterning said first photoresist layer with a contact hole pattern;
    etching said contact hole pattern into said etch-stop layer;
    etching further said contact hole pattern into said first ILD layer until said substructure of said substrate is reached;
    removing said first photoresist layer from said substrate;
    forming organic material over said etch-stop layer and filling said contact hole opening in said etch-stop layer and in said first ILD layer with said organic material;
    performing etch-back of said organic material to expose the surface of said etch-stop layer, such that the surface of said organic material remaining in said contact hole is left flat and level with respect to the surface of said etch-stop layer;
    forming a second interlevel dielectric (ILD) layer over said etch-stop layer including said contact hole opening in said etch-stop layer and in said first ILD layer filled with said organic material;
    forming a second photoresist layer over said second ILD layer;
    patterning said second photoresist layer with a conductive line opening pattern;
    etching through said conductive line opening in said second photoresist layer into said second ILD layer until etch-stop layer is reached;
    removing said second photoresist layer;
    removing remaining said organic material from said contact hole opening in said first ILD layer;
    forming metal in said conductive line opening in said second ILD layer and contact hole opening through said etch-stop layer and in said first ILD layer; and
    removing said metal from the surface of said substrate for subsequent process steps to complete the fabrication of a semiconductor substrate.

2. The method of claim 1, wherein said first ILD layer comprises plasma enhanced (PE) oxide or TEOS chemical vapor deposited and then subjected to chemical mechanical polishing.

3. The method of claim 1, wherein said etch-stop layer has a thickness between about 300 to 500 angstroms (Å).

4. The method of claim 1, wherein said etching through said contact hole pattern in said first photoresist layer into said etch-stop layer is accomplished with a recipe comprising $O_2$ plasma with microwave source.

5. The method of claim 4, wherein said etch-stop layer is SiON or $Si_3N_4$ having a thickness between about 300 to 500 angstroms (Å).

6. The method of claim 1, wherein said etching further said contact hole pattern in said first ILD layer until said substructure of said substrate is reached is accomplished by using a reactive ion etch (RIE) recipe comprising gases Ar, $CHF_3$ and $CF_4$ at a pressure between about 100 to 200 mTorr, or using a high density plasma (HDP) oxide etcher with gases $C_2F_6$, $C_4F_8$ and Ar at a pressure between about 5 to 15 mTorr.

7. The method of claim 1, wherein said forming organic material over said etch-stop layer and filling said contact hole opening in said etch-stop layer and in said first ILD layer with said organic material is accomplished by depositing spin-on-glass, a low k-dielectric or anti-reflective coating.

8. The method of claim 1, wherein said performing etch-back of said organic material to expose said surface of said etch-stop layer is accomplished with a recipe comprising $O_2$ plasma with microwave source.

9. The method of claim 1, wherein said second ILD layer comprises a low-k dielectric, plasma enhanced (PE) oxide or TEOS chemical vapor deposited and then subjected to chemical mechanical polishing.

10. The method of claim 1, wherein said second ILD layer has a thickness between about 4,000 to 7,000 Å.

11. The method of claim 1, wherein said etching through said conductive line opening in said second photoresist layer into said first ILD layer until etch-stop layer is reached is accomplished by using reactive ion etch (RIE) comprising gases $C_4F_8$, Ar, $CHF_3$ and $CF_4$ at a pressure between about 50 to 100 mTorr, or using a high density plasma (HDP) oxide etcher with gases $C_2F_6$, $C_4F_8$, $CH_2F_2$ and Ar at a pressure between about 5 to 15 mTorr.

12. The method of claim 1, wherein said removing remaining said organic material from said contact hole opening in said first ILD layer is accomplished with recipe comprising $O_2$ plasma with a bias energy between about 100 to 200 watts.

13. The method of claim 1, wherein said forming metal in said conductive line opening in said second ILD layer and contact hole opening through said etch-stop layer and in said first ILD layer is accomplished by depositing tungsten or aluminum copper.

14. The method of claim 1, wherein said removing said metal from the surface of said substrate is accomplished by chemical mechanical polishing.

15. A method of forming a dual damascene structure with improved via hole edge profile comprising the steps of:
    providing a semiconductor substrate having a substructure comprising devices formed in said substrate;
    forming a first intermetal dielectric (IMD) layer over said substrate;
    forming an etch-stop layer over said first IMD layer;
    forming a first photoresist layer over said etch-stop layer;
    patterning said first photoresist layer with a via hole pattern;

etching said via hole pattern into said etch-stop layer;

etching further said via hole pattern into said first IMD layer until said substructure of said substrate is reached;

removing said first photoresist layer from said substrate;

forming organic material over said etch-stop layer and filling said via hole opening in said etch-stop layer and in said first IMD layer with said organic material;

performing etch-back of said organic material to expose the surface of said etch-stop layer, such that the surface of said organic material remaining in said via hole is left flat and level with respect to the surface of said etch-stop layer;

forming a second intermetal dielectric (IMD) layer over said etch-stop layer including said via hole opening in said etch-stop layer and in said first IMD layer filled with said organic material;

forming a second photoresist layer over said second IMD layer;

patterning said second photoresist layer with a conductive line opening pattern;

etching through said conductive line opening in said second photoresist layer into said second IMD layer until etch-stop layer is reached;

removing said second photoresist layer;

removing remaining said organic material from said via hole opening in said first IMD layer;

forming metal in said conductive line opening in said second IMD layer and via hole opening through said etch-stop layer and in said first IMD layer; and removing said metal from the surface of said substrate for subsequent process steps to complete the fabrication of a semiconductor substrate.

16. The method of claim 15, wherein said first IMD layer comprises plasma enhanced (PE) oxide or TEOS chemical vapor deposited and then subjected to chemical mechanical polishing.

17. The method of claim 15, wherein said first IMD layer has a thickness between about 8,000 to 12,000 Å.

18. The method of claim 15, wherein said forming an etch-stop layer over said first IMD layer is accomplished by reacting $SiH_4$ with $N_2O$ and He at flow rates between about 60 to 80, 90 to 110 and 100 to 200 sccm, respectively, to form SiON at a pressure between about 1 to 5 torr, energy between about 120 to 140 watts, and temperature between about 330 to 360° C.

19. The method of claim 15, wherein said etch-stop layer has a thickness between about 200 to 500 Å.

20. The method of claim 15, wherein said etching said via hole pattern into said etch-stop layer, and said etching further said via hole pattern in said first IMD layer until said substructure of said substrate is reached is accomplished by using a reactive ion etch (RIE) recipe comprising gases Ar, $CHF_3$ and $CF_4$ at a pressure between about 150 to 200 mTorr, or using a high density plasma (HDP) oxide etcher with gases $C_2F_6$, $C_4F_8$ and Ar at a pressure between about 5 to 15 mTorr.

21. The method of claim 15, wherein said forming organic material over said etch-stop layer and filling said via hole opening in said etch-stop layer and in said first IMD layer with said organic material is accomplished by depositing spin-on-glass, a low k-dielectric or anti-reflective coating.

22. The method of claim 15, wherein said performing etch-back of said organic material to expose said surface of said etch-stop layer is accomplished with a recipe comprising $O_2$ plasma with microwave source.

23. The method of claim 15, wherein said second IMD layer comprises a low-k dielectric, plasma enhanced (PE) oxide or TEOS chemical vapor deposited and then subjected to chemical mechanical polishing.

24. The method of claim 15, wherein said second IMD layer has a thickness between about 4,000 to 7,000 Å.

25. The method of claim 15, wherein said etching through said conductive line opening in said second photoresist layer into said first IMD layer until etch-stop layer is reached is accomplished by using reactive ion etch, (RIE) comprising gases $C_4F_8$, Ar, $CHF_3$ and $CF_4$ at a pressure between about 50 to 100 mTorr, or using a high density plasma (HDP) oxide etcher with gases $C_2F_6$, $C_4F_8$, $CH_2F_2$ and Ar at a pressure between about 5 to 15 mTorr.

26. The method of claim 15, wherein said removing remaining said organic material from said via hole opening in said first IMD layer is accomplished with recipe comprising $O_2$ plasma with a bias energy between about 100 to 200 watts.

27. The method of claim 15, wherein said forming metal in said conductive line opening in said second IMD layer and via hole opening through said etch-stop layer and in said first IMD layer is accomplished by depositing tungsten or aluminum copper.

28. The method of claim 15, wherein said removing said metal from the surface of said substrate is accomplished by chemical mechanical polishing.

* * * * *